(12) United States Patent
Ekambaram

(10) Patent No.: US 11,456,827 B2
(45) Date of Patent: Sep. 27, 2022

(54) TEST SYSTEM, ELECTRONIC DEVICE AND LOOPBACK TESTING METHOD

(71) Applicant: Rohde & Schwarz GmbH & Co. KG, Munich (DE)

(72) Inventor: Prabhakaran Ekambaram, Singapore (SG)

(73) Assignee: Rohde & Schwarz GmbH & Co. KG, Munich (DE)

( * ) Notice: Subject to any disclaimer, the term of this patent is extended or adjusted under 35 U.S.C. 154(b) by 83 days.

(21) Appl. No.: 17/060,404

(22) Filed: Oct. 1, 2020

(65) Prior Publication Data

US 2022/0109533 A1 Apr. 7, 2022

(51) Int. Cl.
*H04W 24/00* (2009.01)
*H04L 1/24* (2006.01)
*G01R 31/317* (2006.01)

(52) U.S. Cl.
CPC ........ *H04L 1/243* (2013.01); *G01R 31/31716* (2013.01)

(58) Field of Classification Search
CPC . H04B 3/46; H04B 3/06; H04B 3/542; H04B 3/54; H04B 3/52; G01R 31/58; G01R 31/08; G01R 31/085; H04W 24/02; H04L 41/0816; H04L 41/12; H04L 67/10; H04L 14/0268; H04L 41/5025; H04L 41/0654; H04L 45/28; H04L 47/12; H04L 49/557; H04L 69/40; H04J 2203/006
See application file for complete search history.

(56) References Cited

U.S. PATENT DOCUMENTS

| | | | |
|---|---|---|---|
| 10,498,591 B1 * | 12/2019 | Ramana | H04L 41/0659 |
| 10,644,831 B2 * | 5/2020 | Henry | H02J 13/00007 |
| 11,232,872 B2 * | 1/2022 | Pulitzer | G16H 80/00 |
| 2011/0319071 A1 * | 12/2011 | Beppler | H04W 48/18 |
| | | | 455/424 |
| 2016/0112263 A1 * | 4/2016 | Henry | H04B 3/46 |
| | | | 370/250 |
| 2019/0296853 A1 * | 9/2019 | Henry | H04L 1/0025 |
| 2021/0397170 A1 * | 12/2021 | Zhou | G05B 19/41875 |

\* cited by examiner

*Primary Examiner* — Jung Liu
(74) *Attorney, Agent, or Firm* — Christensen O'Connor Johnson Kindness PLLC

(57) ABSTRACT

A test system for performing loopback tests is described. The test system includes a processing circuitry and loopback circuitry. The processing circuitry (e.g., module) includes a signal source, an artificial intelligence module, an output port, and an input port, wherein the output port is connected to the input port by the loopback circuitry. The signal source is configured to generate an output signal. The processing module is configured to output the output signal via the output port. The loopback circuitry is configured to at least one of transmit the output signal to the input port directly and transmit the output signal to the input port via at least one further electronic component, thereby obtaining at least one input signal. The input port is configured to receive the at least one input signal. The input port further is configured to forward the at least one input signal to the artificial intelligence module. The artificial intelligence module is configured to automatically perform a loopback test of at least one of the signal source and the further electronic component based on the at least one input signal. Further, an electronic device and a loopback testing method is described.

20 Claims, 4 Drawing Sheets

TEST SYSTEM, ELECTRONIC DEVICE AND LOOPBACK TESTING METHOD

FIELD OF THE DISCLOSURE

Embodiments of the present disclosure generally relate to a test system for performing loopback tests. Embodiments of the present disclosure further relate to a loopback testing method.

BACKGROUND

Signal processing devices and signal generating devices often comprise several electronic components that consecutively process a signal in several stages, thereby altering or rather transforming the signal several times.

For example, signals that are to be transmitted as radio signals have to undergo various transformations in multiple sub-systems prior to their transmission.

In order to ensure the correct functionality of such electronic devices, multiple tests of the individual sub-systems, namely so-called loopback tests, have to be performed by hand. This is a rather time-consuming task that requires a lot of knowledge about the individual sub-systems from a user.

Accordingly, there is a need for a test system as well as a testing method that allow for an easier and/or faster testing of individual sub-systems of an electronic device.

SUMMARY

Embodiments of the present disclosure provide a test system for performing loopback tests. In an embodiment, the test system comprises a processing module composed of, for example one or more circuits, and loopback circuitry. The processing module comprises a signal source, an artificial intelligence circuit or module, an output port, and an input port, wherein the output port is connected to the input port by the loopback circuitry. The signal source is configured to generate an output signal. The processing module is configured to output the output signal via the output port. The loopback circuitry is configured to at least one of transmit the output signal to the input port directly and transmit the output signal to the input port via at least one further electronic component, thereby obtaining at least one input signal. The input port is configured to receive the at least one input signal. The input port further is configured to forward the at least one input signal to the artificial intelligence module. The artificial intelligence module is configured to automatically perform a loopback test of at least one of the signal source and the further electronic component based on the at least one input signal.

Accordingly, the loopback circuitry may feed back the original output signal to the input port, such that the artificial intelligence module may perform the loopback test of the signal source based on the input signal being associated with the original output signal of the signal source.

In other words, the artificial intelligence module may analyze the input signal being associated with the original output signal of the signal source in order to identify potential errors in the input signal being associated with a malfunction of the signal source.

Alternatively or additionally, the loopback circuitry may feed back a processed output signal to the input port, wherein the processed output signal corresponds to the output signal after processing by the further electronic component. Thus, the artificial intelligence module may perform the loopback test of the further electronic component based on the input signal being associated with the processed output signal.

In other words, the artificial intelligence module may analyze the input signal being associated with the processed output signal of the further electronic component in order to identify potential errors in the input signal being associated with a malfunction of the further electronic component.

Accordingly, several loops may be established by the loopback circuitry. In some embodiments, a first loop is established from the signal source to the output port, to the input port, and to the artificial intelligence module. A second loop is established from the signal source to the output port, to the further electronic component, to the input port, and to the artificial intelligence module.

The test system according to the present disclosure provides the possibility to perform the loopback test of the signal source and/or of the further electronic component in a fully automated manner.

No expert knowledge is required from a user of the test system, as the artificial intelligence module already comprises all necessary information in order to perform the loopback test automatically.

In some embodiments, the artificial intelligence module comprises a computer program with program code, computer instructions, scripts, etc., that are configured to perform the loopback test based on the at least one input signal when the computer program is executed on a processing unit of the test system. The artificial intelligence module may have a non-transitory computer-readable medium on which the computer program is stored. In an embodiment, the processing unit may include any processor circuits, such as a microprocessor, a microcontroller, a central processing unit, a graphics processing unit (GPU), a digital signal processor (DSP), etc.

Hence, the artificial intelligence module is configured to perform algorithms that perform the loopback test based on the at least one input signal appropriately. In other words, the artificial intelligence module uses mathematics and logic to produce an output that is associated with the result of the loopback test performed based on the at least one input signal.

According to an aspect of the present disclosure, the artificial intelligence module is configured to perform the loopback test of at least one of the signal source and the further electronic component automatically based on information associated with the output signal. In general, the information associated with the output signal may relate to an amplitude of the output signal, to a frequency of the output signal and/or to a phase of the output signal. Thus, the loopback test is performed based on additional knowledge on the general shape of the original output signal generated by the signal source.

For example, the information associated with the output signal may be IQ data that is used for generating the output signal.

According to another aspect of the present disclosure, the artificial intelligence module is configured to compare the output signal and the input signal in order to perform the loopback test. In general, a specific shape of the output signal is associated with a specific shape of the input signal, if the signal source and/or the further electronic component are working correctly. Moreover, certain malfunctions of the signal source and/or of the further electronic components may be associated with specific deformations of the shape of the input signal compared to the output signal. Accordingly, malfunctions of the signal source and/or of the further electronic component can be detected and identified by comparing the input signal to the output signal.

In a further embodiment of the present disclosure, the artificial intelligence module is established as a machine learning module, the machine learning module being configured to perform the loopback test by a machine learning technique. More specifically, the machine learning module is trained to perform the loopback test by the machine learning technique.

For example, the machine learning module may be fed with data sets comprising output signals and corresponding input signals of correctly functioning signal sources and/or of correctly functioning electronic components in order to train the machine learning module. Thus, the machine learning module may be trained to identify input signals being associated with correctly functioning signal sources and/or further electronic components.

Alternatively or additionally, the machine learning module may be fed with data sets comprising output signals and corresponding input signals of malfunctioning signal sources and/or of mal functioning electronic components in order to train the machine learning module. Thus, the machine learning module may be trained to identify input signals being associated with malfunctioning signal sources and/or electronic components.

According to an aspect of the present disclosure, the machine learning module comprises an artificial neural network. The artificial neural network may be trained to perform the loopback test of the signal source and/or of the further electronic component.

In some embodiments, the artificial neural network comprises a convolutional neural network (CNN). This type of artificial neural network is particularly suitable for processing waveforms and/or images.

Accordingly, the input signal or samples associated with the input signal may be used as an input for the artificial neural network. Alternatively or additionally, the input signal may be converted into an image, and the image may be used as an input for the artificial neural network.

The at least one further electronic component may be established as an accelerator unit, as a protocol stack unit, as a motherboard, as an RF mixer unit, as a modulation unit, as a demodulation unit, as an analog-to-digital converter, as a digital-to-analog converter, as a filter unit, or as remote radio head. In some embodiments, the test system may comprise several or all of these electronic components.

The loopback circuitry may be configured to connect each of the further electronic components to the input port of the processing module. Thus, several loops may be established, namely one loop for each further electronic component. This way, each of the further electronic components can be testes via the loopback test.

According to a further aspect of the present disclosure, the at least one further electronic component comprises an uplink channel and a downlink channel. In general, the uplink channel and the downlink channel of a correctly functioning electronic component should process a signal in an approximately inverse way. In other words, processing a signal first by the uplink channel and then by the downlink channel should keep the signal approximately unaltered, if the electronic component is functioning correctly.

For example, the uplink channel may be associated with modulating the signal, while the downlink channel may be associated with demodulating the signal.

In a further embodiment of the present disclosure, the loopback circuitry is configured to transmit the output signal to the input port via both the uplink channel and the downlink channel. Thus, the loopback circuitry may loop back an output signal processed by the uplink channel to the downlink channel. Accordingly, the input signal being analyzed by the artificial intelligence module corresponds to the output signal being processed by both the uplink channel and the downlink channel. Thus, errors being associated with both of the uplink channel and the downlink channel may be identified by the loopback test.

Alternatively, the loopback circuitry may loop back the output signal processed by the uplink channel directly to the input port of the processing module. Thus, errors being associated with only uplink channel may be identified by the loopback test.

The artificial intelligence module may be configured to identify an error source based on the at least one input signal. As already described above, certain deviations of the shape of the input signal compared to the shape of an ideal input signal corresponding to a correctly functioning signal source and/or further electronic component are associated with certain malfunctions of the signal source and/or of the further electronic component. Thus, the error source can be identified based on the shape the input signal.

According to an aspect of the present disclosure, the signal source is configured to generate the output signal with predefined properties. For example, the output signal may be established as a predefined test signal, such that normed testing conditions are established for the loopback test.

In some embodiments, the machine learning module may be trained based on the predefined test signal being generated by a correctly functioning signal source and being processed by a correctly functioning further electronic component.

Alternatively or additionally, the machine learning module may be trained based on the predefined test signal being generated by a malfunctioning signal source and/or being processed by a malfunctioning further electronic component.

In a further embodiment of the present disclosure, the output signal is established as a digital signal. For example, the output signal may be established as an IQ signal.

Embodiments of the present disclosure further provide an electronic device, comprising a test system described above.

Thus, the electronic device according to the present disclosure may be established as a self-testing electronic device. Thus, no additional test equipment is necessary, as the electronic device may automatically test the functionality of its individual electronic components automatically.

For example, the electronic device may be established as an RF transceiver, as a mobile communication device, as a network card, or as any other type of electronic device being configured to generate and receive electronic signals.

Regarding the further advantages and properties of the electronic device, reference is made to the explanations given above with respect to the test system, which also hold for the electronic device and vice versa.

Embodiments of the present disclosure further provide a loopback testing method. In an embodiment, the loopback testing method comprises the following steps:

generating an output signal by a signal source of a processing circuit, the processing circuit having an input port and an output port;

transmitting the output signal from the output port to the input port by loopback circuitry directly or via at least one further electronic component, thereby obtaining at least one input signal;

receiving the input signal by the input port; and performing a loopback test of at least one of the signal source and the further electronic component based on the at least one input signal by an artificial intelligence circuit.

The test system described above may be configured to perform the testing method according to the present disclosure.

Regarding the further advantages and properties of the testing method, reference is made to the explanations given above with respect to the test system, which also hold for the testing method and vice versa.

According to an aspect of the present disclosure, the loopback test is performed based on both the input signal and information associated with the output signal. In general, the information associated with the output signal may relate to an amplitude of the output signal, to a frequency of the output signal and/or to a phase of the output signal. Thus, the loopback test is performed based on additional knowledge on the general shape of the original output signal generated by the signal source.

For example, the information associated with the output signal may be IQ data that is used for generating the output signal.

The loopback test may be performed by a machine learning technique. More specifically, a machine learning module may be trained to perform the loopback test by the machine learning technique, as described above.

According to another aspect of the present disclosure, the loopback test is performed by an artificial neural network. The artificial neural network may be trained to perform the loopback test of the signal source and/or of the further electronic component.

In some embodiments, the artificial neural network comprises a convolutional neural network (CNN). This type of artificial neural network is particularly suitable for processing waveforms and/or images.

In a further embodiment of the present disclosure, the at least one further electronic component is established as an accelerator unit, as a protocol stack unit, as a motherboard, as an RF mixer unit, as a modulation unit, as a demodulation unit, as an analog-to-digital converter, as a digital-to-analog converter, as a filter unit, or as remote radio head. The loopback circuitry may connect each of the further electronic components to the input port of the processing module. Thus, several loops may be established, namely one loop for each further electronic component. This way, each of the further electronic components can be testes via the loopback test.

The at least one further electronic component may comprise an uplink channel and a downlink channel, wherein the output signal is transmitted to the input port via both the uplink channel and the downlink channel. In general, the uplink channel and the downlink channel of a correctly functioning electronic component should process a signal in an approximately inverse way. In other words, processing a signal first by the uplink channel and then by the downlink channel should keep the signal approximately unaltered, if the electronic component is functioning correctly.

For example, the uplink channel may be associated with modulating the signal, while the downlink channel may be associated with demodulating the signal.

According to another aspect of the present disclosure, at least one error source is identified based on the at least one input signal. Certain deviations of the shape of the input signal compared to the shape of an ideal input signal corresponding to a correctly functioning signal source and/ or further electronic component are associated with certain malfunctions of the signal source and/or of the further electronic component. Thus, the error source can be identified based on the shape the input signal.

In some embodiments, the output signal is generated with predefined properties. For example, the output signal may be established as a predefined test signal, such that normed testing conditions are established for the loopback test.

In some embodiments, the machine learning module may be trained based on the predefined test signal being generated by a correctly functioning signal source and being processed by a correctly functioning further electronic component.

Alternatively or additionally, the machine learning module may be trained based on the predefined test signal being generated by a malfunctioning signal source and/or being processed by a malfunctioning further electronic component.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
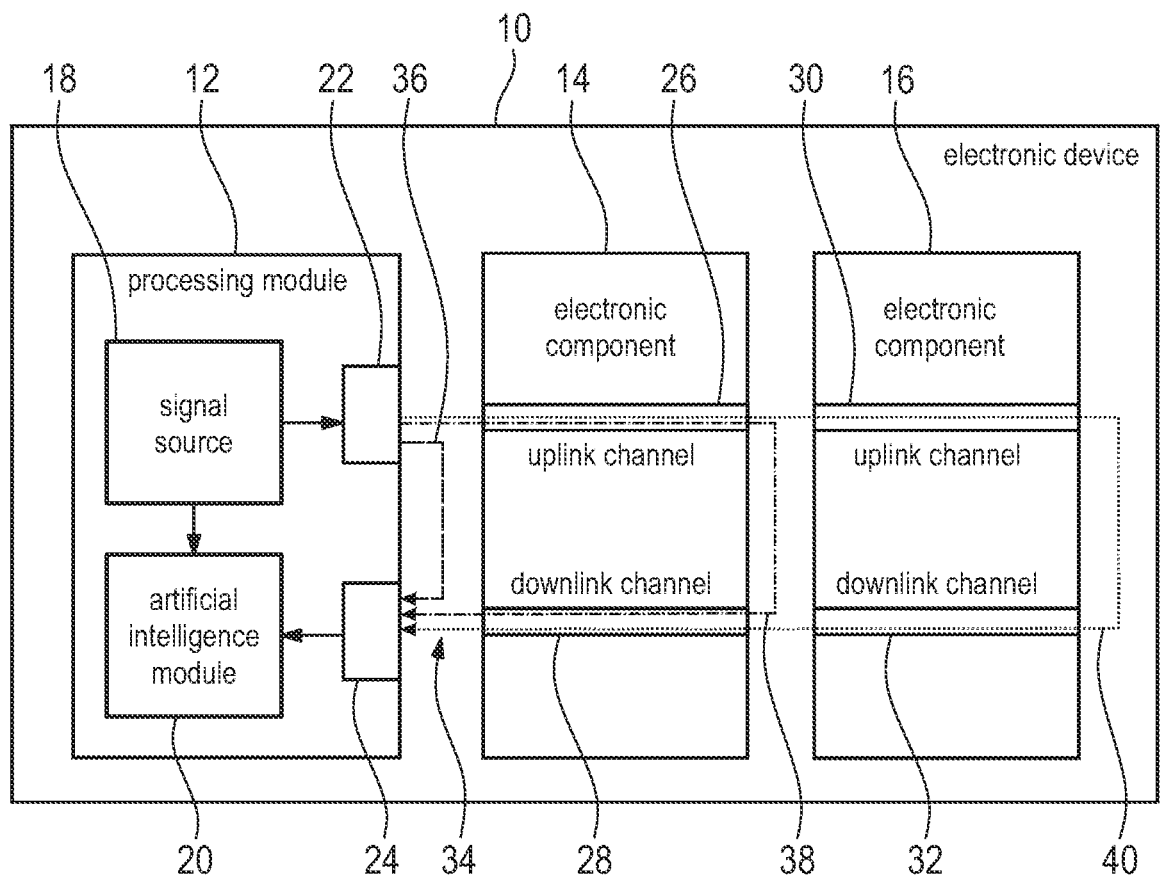
FIG. 1 schematically shows an electronic device with a test system according to an embodiment of the present disclosure.

FIG. 1 schematically show an electronic device 10. In general, the electronic device 10 is configured to receive and transmit electromagnetic signals in one or several predetermined frequency bands. In some embodiments, the electronic device 10 may comprise an RF transceiver being configured to receive and transmit the electromagnetic signals.

For example, the electronic device 10 may be established as a mobile communication device being configured to communicate with other electronic devices based on 3G, 4G, or 5G. Accordingly, the electronic device 10 may be configured to transmit and receive electromagnetic signals based on MIMO and/or OFDM-techniques.

In the exemplary the embodiment shown in FIG. 1, the electronic device 10 comprises a processing module 12 composed of, for example, one or more circuits, a first further electronic component 14, and a second further electronic component 16.

Therein and in the following, the term "module" is understood to describe suitable hardware, suitable software, or a combination of hardware and software that is configured to have a certain functionality. The hardware may, inter alia, comprise a CPU, a GPU, an FPGA, an ASIC, or other types of electronic circuitry.

It is to be understood that the electronic device 10 may comprise an arbitrary number of other electronic components. For example, each of the further electronic components may be established as an accelerator unit, as a protocol stack unit, as a motherboard, as an RF mixer unit, as a modulation unit, as a demodulation unit, as an analog-to-digital converter, as a digital-to-analog converter, as a filter unit, or as remote radio head. In some embodiments, the electronic device 10 may comprise several or all of these electronic components.

In the embodiment shown, the processing module 12 comprises a signal source 18, an artificial intelligence circuit or module 20, an output port 22, and an input port 24. The signal source 18 is connected to the output port 22 and to the artificial intelligence module 20 in a signal transmitting manner. Further, the artificial intelligence module 20 is connected to the input port 24 in a signal transmitting manner.

Therein and in the following, the term "connected in a signal transmitting manner" is understood to denote a cable-based or wireless connection that is configured to transmit signals between the respective devices or components.

The first further electronic component 14 comprises an uplink channel 26 and a downlink channel 28. Similarly, the second further electronic component 16 comprises an uplink channel 30 and a downlink channel 32.

In general, an uplink channel and a downlink channel of a correctly functioning electronic component should process a signal in an approximately inverse way. In other words, processing a signal first by the uplink channels 26, 30 and then by the downlink channels 28, 32 should keep the signal approximately unaltered (i.e. up to small perturbations), if the electronic components 14, 16 are functioning correctly.

For example, one of the uplink channels 26, 30 may be associated with modulating the signal, while the associated downlink channel 28, 32 may be associated with demodulating the signal.

In order to ensure that the signal source 18 and/or the further electronic components 14, 16 are functioning correctly, the electronic device 10 comprises loopback circuitry 34, wherein the loopback circuitry 34 and the artificial intelligence module 20 together form a test system for performing loopback tests of the electronic device 10.

The loopback circuitry 34 connects the output port 22 with the input port 24 directly, via the first stage the electronic component 14, and via the second further electronic component 16.

In an embodiment, a first loop 36 of the loopback circuitry 34 is established as a direct connection of the output ports 22 to the input port 24. A second loop 38 is established as a connection between the output port 22 and the input port 24 via the uplink channel 26 and the downlink channel 28 of the first further electronic component 14. A third loop 40 is established as a connection between the output port 22 and the input port 24 via the uplink channel 26 of the first further electronic component 14, the uplink channel 30 of the second further electronic component 16, the downlink channel 32 of the second further electronic component 16, and the downlink channel 28 of the first further electronic component 14.

The test system is configured to perform, for example, a loopback testing method that is described in the following with reference to FIG. 2.

An output signal is generated by the signal source 18 (step S1). The output signal may be established as a digital signal, for example as an IQ signal being generated based on IQ data.

The output signal is transmitted from the output port 22 to the input port 24 via the loopback circuitry 34, thereby obtaining at least one input signal (step S2). More precisely, the output signal may be transmitted from the output port 22 to the input port 24 via the first loop 36. Thus, in this case the input signal is (essentially) identical to the output signal generated by the signal source 18.

Alternatively or additionally, the output signal may be transmitted from the output port 22 to the input port 24 via the second loop 38. In this case, the input signal corresponds to the output signal that has been processed by the uplink channel 26 and the downlink channel 28 of the first further electronic component 14.

Alternatively or additionally, the output signal may be transmitted from the output port 22 to the input port 24 via the third loop 40. In this case, the input signal corresponds to the output signal that has been processed by the uplink channels 26, 30 and the downlink channels 28, 32 of the first further electronic component 14 and of the second further electronic component 16.

The at least one input signal is received by the input port 24 and forwarded to the artificial intelligence module 20 (step S3).

The artificial intelligence module 20 automatically performs a loopback test of the signal source 18, the first further electronic component 14 and/or the second further electronic component 16 based on the received input signal (step S4).

The loopback test may be performed based on additional information on the original output signal. In general, the additional information may relate to an amplitude of the output signal, to a frequency of the output signal and/or to a phase of the output signal. In some embodiments, the additional information is established as IQ data being used for generating the output signal. The additional information may be forwarded from the signal source 18 to the artificial intelligence module 20.

In general, a specific shape of the output signal is associated with a specific shape of the input signal, if the signal source 18 and the further electronic components 14, 16 are working correctly. Moreover, certain malfunctions of the signal source 18 and/or of the further electronic components 14, 16 may be associated with specific deformations of the shape of the input signal compared to the output signal. This is illustrated in FIGS. 3A to 3D.

Figure 3A:
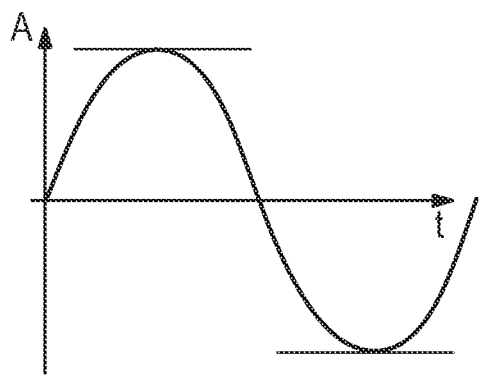
FIGS. 3A to 3D show a diagram of an output signal and three input signals of the test system of FIG. 1 plotted against time, respectively.

FIG. 3A shows an amplitude A of an exemplary output signal generated by the signal source 18 plotted against time t.

Figure 3B:
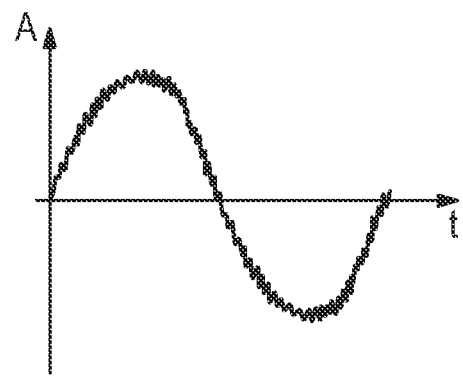

FIG. 3B shows an input signal being associated with the output signal of FIG. 3A, wherein the input signal only comprises small perturbations compared to the output signal. As each of amplitude, phase and frequency of the input signal is essentially equal to the amplitude, phase and frequency of the output signal, the signal source 18 and the further electronic components 14, 16 are working correctly, and the loopback test is passed.

Figure 3C:
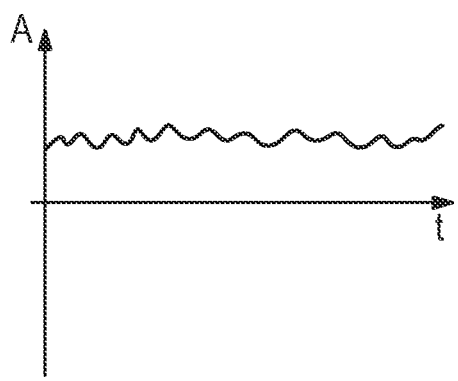

FIG. 3C shows an input signal being associated with the output signal of FIG. 3A, wherein the input signal is heavily deformed compared to the output signal. Thus, it can be deduced that the signal source 18, the first further electronic component 14 and/or the second further electronic component 16 may not be working correctly, and the loopback test is failed.

Figure 3D:
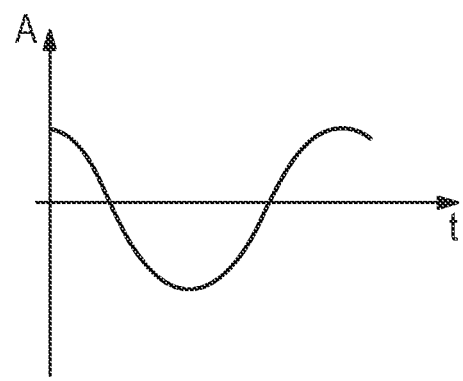

FIG. 3D shows an input signal being associated with the output signal of FIG. 3A, wherein the input signal is phase shifted compared to the output signal. Thus, it can be deduced that the signal source 18, the first further electronic component 14 and/or the second further electronic component 16 may not be working correctly, as one or several of these components may introduce an unwanted phase shift. Depending on the magnitude of the phase shift, the loopback test may be passed or failed.

Accordingly, specific malfunctions of the signal source 18 and/or of the further electronic components 14, 16 can be detected and identified by comparing the input signal to the output signal.

Thus, the artificial intelligence module 20 may compare the generated output signal or rather the additional information being associated with the output signal with the received input signal in order to perform the loopback test.

For example, the artificial intelligence module 20 may comprise an expert system being configured to analyze the input signal, and further being configured to identify errors in the signal source 18, the first further electronic component 14, or the second further electronic component 16 based on the analysis of the input signal. More specifically, the expert system may identify errors based on a predetermined set of rules that are applied to the input signal. Alternatively or additionally, the artificial intelligence module 20 may comprise a machine learning module that is trained to perform the loopback test by machine learning techniques.

In some embodiments, the machine learning module may comprise an artificial neural network that is trained to perform the loopback test. For example, the artificial neural network comprises a convolutional neural network (CNN).

Figure 4:
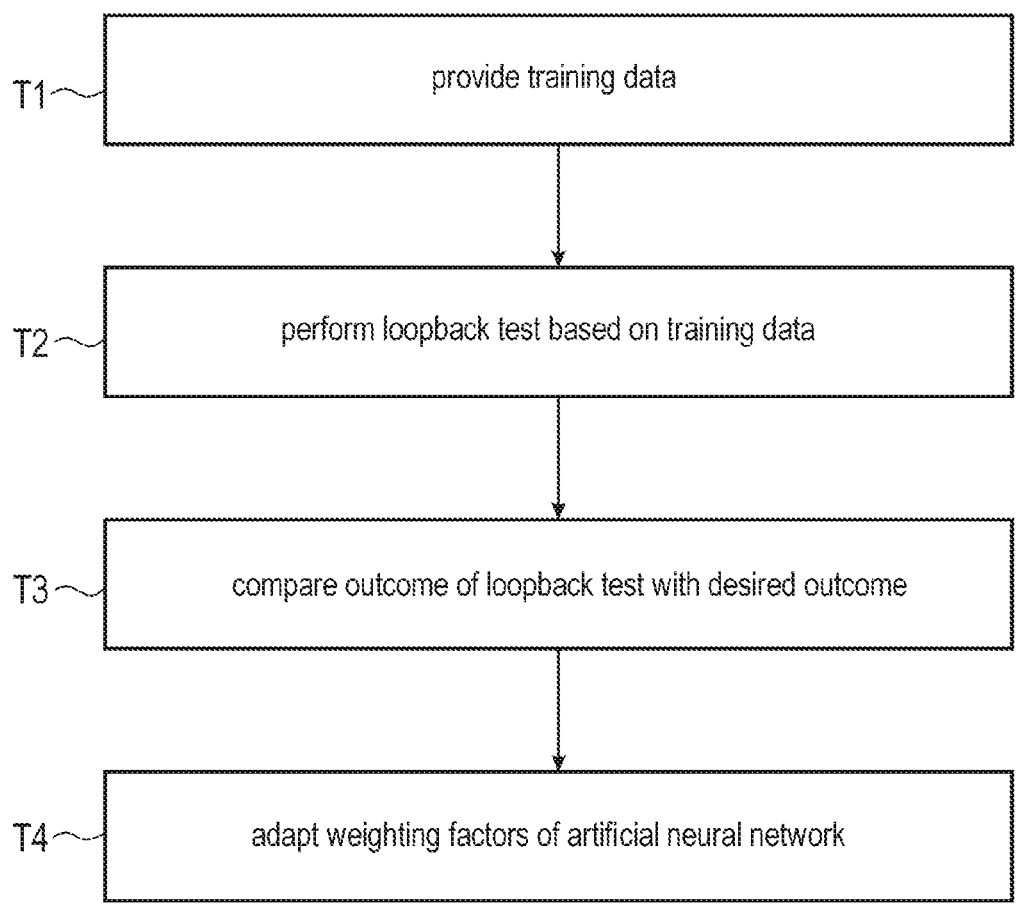
FIG. 4 shows a block diagram of a representative training method for training an artificial neural network of the test system of claim 1.

Without restriction of generality, the case of an artificial neural network being trained for performing the loopback test is described in the following with reference to FIG. 4.

Training data, for example labelled training data, is provided for training the artificial neural network (step T1). The training data comprises data sets with output signals and the corresponding input signals being associated with correctly functioning signal sources and/or correctly functioning further electronic components. Alternatively or additionally, the training data comprises data sets with output signals and the corresponding input signals being associated with malfunctioning signal sources and/or with malfunctioning further electronic components.

Therein, the training data may comprise the input signals and the output signals themselves, or rather samples being associated with the input signals and the output signals. Alternatively or additionally, the input signals and the output signals may be converted into respective images, and the training data may comprise the images.

The artificial neural network is fed with the training data, and the training data is processed by the artificial neural network (step T2). More precisely, the artificial neural network performs a loopback test based on the training data provided to the artificial neural network. In other words, the artificial neural network tries to identify faults and errors being associated with the input signals and the output signals provided to the artificial neural network with the training data.

As a result of step T2, the artificial neural network may decide whether the loopback test is passed or failed, and in the case of a failed loopback test may determine an error source being responsible for the failure.

The result of the loopback test performed by the artificial neural network is compared with an desired outcome of the loopback test (step T3).

For example, if the training data is established is labelled training data, the desired outcome may be part of the training data. For example, the training data comprises information on specific faults or errors of certain electronic components that are encoded in the respective input signal.

If the result of the loopback test performed by the artificial neural network deviates from the desired outcome of the loopback test, weighting factors of the artificial neural network are adapted, thereby training the artificial neural network (step T4).

It is noted that the training method described above is only one of several different possible training methods. Of course, any other suitable training method for training the machine learning module or the artificial neural network may be employed.

Summarizing, the machine learning module or rather the artificial neural network is trained to automatically detect errors in an input signal, and to identify the error source being associated with the respective error.

Thus, the test system described above provides the possibility to perform the loopback test of the signal source 18 and/or of the further electronic components 14, 16 in a fully automated manner.

No expert knowledge is required from a user of the electronic device 10, as the artificial intelligence module 20 already comprises all necessary information in order to perform the loopback test automatically.

Figure 2:
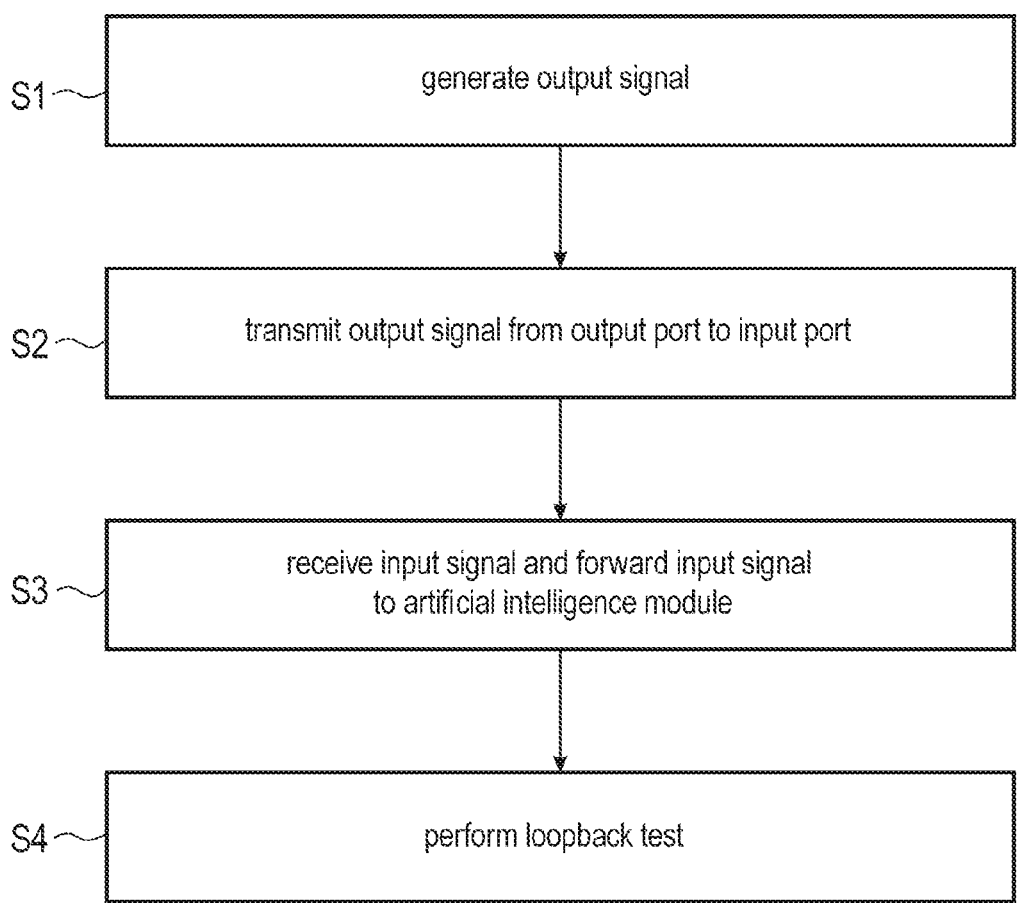
FIG. 2 shows a block diagram of a representative loopback testing method according to an embodiment of the present disclosure.

The electronic device 10, including such components as, for example, the processing module 12, loopback circuitry 34, etc., is configured to perform one or more steps schematically shown, for example, in FIGS. 2 and/or 4. In some embodiments, one or more of these components includes one or more computer-readable media containing computer readable instructions embodied thereon that, when executed by one or more computer circuits (contained in or associated with the electronic device 10 or components thereof), cause the one or more computer circuits to perform one or more steps of the method of FIGS. 2 and/or 4 described above. In some embodiments, the one or more computer circuits includes a microprocessor, a microcontroller, a central processing unit, a graphics processing unit (GPU), a digital signal processor (DSP), etc.

In some embodiments, the one or more computer-readable media contains computer readable instructions embodied thereon that, when executed by the one or more computer circuits, cause the one or more computer circuits to perform one or more steps of any of the methods of claims 13-20.

As described briefly above, certain embodiments disclosed herein utilize circuitry (e.g., one or more circuits) in order to implement standards, protocols, methodologies or technologies disclosed herein, operably couple two or more components, generate information, process information, analyze information, store information, display information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices or computer circuits such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the modules, units, etc., described above, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test system for performing loopback tests, said test system comprising a processing module and loopback circuitry,
said processing module comprising a signal source, an artificial intelligence circuit, an output port, and an input port;
said output port being connected to said input port by said loopback circuitry;
said signal source being configured to generate an output signal;
said processing module being configured to output the output signal via said output port;
said loopback circuitry being configured to at least one of transmit said output signal to said input port directly and transmit said output signal to said input port via at least one further electronic component, thereby obtaining at least one input signal;
said input port being configured to receive said at least one input signal, said input port further being configured to forward said at least one input signal to said artificial intelligence circuit; and
said artificial intelligence circuit being configured to automatically perform a loopback test of at least one of said signal source and said further electronic component based on said at least one input signal,
wherein said processing module, said loopback circuitry, and said at least one further electronic component are integrated into a single electronic device.

2. The test system of claim 1, wherein said artificial intelligence circuit is configured to automatically perform said loopback test of at least one of said signal source and said further electronic component based on information associated with said output signal.

3. The test system of claim 2, wherein said artificial intelligence circuit is configured to compare said output signal and said input signal in order to perform said loopback test.

4. The test system of claim 1, wherein said artificial intelligence circuit is established as a machine learning module, said machine learning module being configured to perform said loopback test by a machine learning technique.

5. The test system of claim 4, wherein said machine learning module comprises an artificial neural network.

6. The test system of claim 1, wherein said at least one further electronic component is established as an accelerator unit, as a protocol stack unit, as a motherboard, as an RF mixer unit, as a modulation unit, as a demodulation unit, as an analog-to-digital converter, as a digital-to-analog converter, as a filter unit, or as remote radio head.

7. The test system of claim 1, wherein said at least one further electronic component comprises an uplink channel and a downlink channel.

8. The test system of claim 7, wherein said loopback circuitry is configured to transmit said output signal to said input port via both said uplink channel and said downlink channel.

9. The test system of claim 1, wherein said artificial intelligence circuit is configured to identify an error source based on said at least one input signal.

10. The test system of claim 1, wherein said signal source is configured to generate said output signal with predefined properties.

11. The test system of claim 1, wherein said output signal is established as a digital signal.

12. An electronic device, comprising a test system for performing loopback tests and at least one further electronic component,
said test system comprising a processing module and loopback circuitry,
said processing module comprising a signal source, an artificial intelligence circuit, an output port, and an input port;
said output port being connected to said input port by said loopback circuitry;
said signal source being configured to generate an output signal;
said processing module being configured to output the output signal via said output port;
said loopback circuitry being configured to at least one of transmit said output signal to said input port directly and transmit said output signal to said input port via said at least one further electronic component, thereby obtaining at least one input signal;
said input port being configured to receive said at least one input signal, said input port further being configured to forward said at least one input signal to said artificial intelligence circuit; and said artificial intelligence circuit being configured to automatically perform a loopback test of at least one of said signal source and said further electronic component based on said at least one input signal, wherein said processing module, said loopback circuitry, and said at least one further electronic component are integrated into said electronic device.

13. A loopback testing method, said loopback testing method comprising:

generating an output signal by a signal source of a processing module, said processing module having an input port and an output port;

transmitting said output signal from said output port to said input port by loopback circuitry directly or via at least one further electronic component, thereby obtaining at least one input signal;

receiving said input signal by said input port; and performing a loopback test of at least one of said signal source and said further electronic component based on said at least one input signal by an artificial intelligence circuit, wherein said processing module, said loopback circuitry, and said at least one further electronic component are integrated into a single electronic device.

14. The loopback testing method of claim 13, wherein said loopback test is performed based on both said input signal and information associated with said output signal.

15. The loopback testing method of claim 13, wherein said loopback test is performed by a machine learning technique.

16. The loopback testing method of claim 13, wherein said loopback test is performed by an artificial neural network.

17. The loopback testing method of claim 13, wherein said at least one further electronic component is established as an accelerator unit, as a protocol stack unit, as a motherboard, as an RF mixer unit, as a modulation unit, as a demodulation unit, as an analog-to-digital converter, as a digital-to-analog converter, as a filter unit, or as remote radio head.

18. The loopback testing method of claim 13, wherein said at least one further electronic component comprises an uplink channel and a downlink channel, and wherein said output signal is transmitted to said input port via both said uplink channel and said downlink channel.

19. The loopback testing method of claim 13, wherein at least one error source is identified based on said at least one input signal.

20. The loopback testing method of claim 13, wherein said output signal is generated with predefined properties.

* * * * *